United States Patent [19]
Taura

[11] Patent Number: 5,815,449
[45] Date of Patent: Sep. 29, 1998

[54] SEMICONDUCTOR MEMORY DEVICE

[75] Inventor: Tadayuki Taura, Zushi, Japan

[73] Assignee: Kabushiki Kaisha Toshiba, Tokyo, Japan

[21] Appl. No.: 929,574

[22] Filed: Sep. 15, 1997

[30] Foreign Application Priority Data

Sep. 19, 1996 [JP] Japan .................................. 8-247397

[51] Int. Cl.⁶ .................................................. G11C 7/00
[52] U.S. Cl. ..................................... 365/200; 365/189.07
[58] Field of Search ............................... 365/200, 189.07

[56] References Cited

U.S. PATENT DOCUMENTS

| 4,881,200 | 11/1989 | Urai | 365/200 |
| 5,122,987 | 6/1992 | Kihara | 365/200 |
| 5,604,703 | 2/1997 | Nagashima | 365/200 |

Primary Examiner—David C. Nelms
Assistant Examiner—Trong Phan
Attorney, Agent, or Firm—Loeb & Loeb LLP

[57] ABSTRACT

In a nonvolatile semiconductor memory device, upon receiving a defective cell address detection signal HIT, the read-out potential node (VSA NODE 1, VSA NODE 2) and the reference potential node (VREF NODE 1, VREF NODE 2) are equalized to shorten the read-out time required for reading the redundancy memory cell. Furthermore, in a nonvolatile semiconductor memory device having an ATD circuit, the equalizing times of the read-out potential node and the reference potential node are separately set to shorten the read-out time required for reading the main memory cell. With these features, there is overcome a disadvantage in prior art that the read-out time required for reading the redundancy memory cell is longer than the read-out time required for reading the main memory cell due to the slow rising of the HIT signal for detecting the defective cell address.

12 Claims, 7 Drawing Sheets

SEMICONDUCTOR MEMORY DEVICE

BACKGROUND OF THE INVENTION

The present invention relates to a semiconductor memory device using a MOS-type transistor as a storage element from which data can be read out.

A conventional method of accessing data of a semiconductor memory device will be explained below by using an EEPROM (Electrically Erasable Programmable Read-only Memory) to which data is written and from which data is erased electrically respectively. In the EEPROM to which and from which data can be written and erased electrically respectively, either "1" or "0" data is read out based on a result of a comparison between read out-potentials VSA1 and VSA0 corresponding to a cell data "1" or "0" and a reference potential VREF by a sense amplifying circuit at the time of reading out the data.

Figure 7:
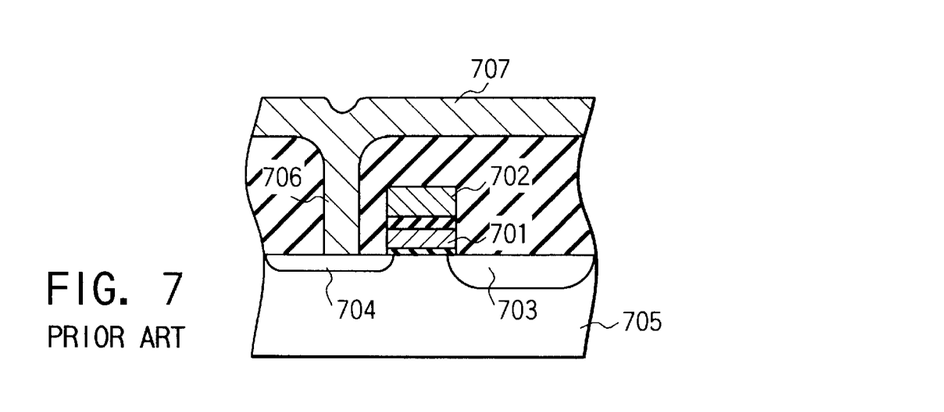
FIG. 7 is a diagram for showing a structure of a non-volatile semiconductor memory cell.

A non-volatile transistor used as a memory cell of the EEPROM for electrically erasing data is formed by a two-layer polycrystalline silicon as shown in FIG. 7, in which a floating gate 701 is structured by a first polycrystalline silicon layer and a control gate 702 is formed by a second polycrystalline silicon layer. 703 denotes a source, 704 a drain, 705 a silicon substrate, 706 a contact hole, and 707 a data line formed by aluminum which is connected to the drain 704 through the contact hole 706. The operation of data writing, data erasing and data reading in the memory cell having the above-described structure will be explained in brief below.

The write operation is carried out by injecting a hot electron to the floating gate with a drain potential VD set at 5.5 V, a control gate potential VCG set at 10 V and a source potential VS set at 0 V respectively. For carrying out the erase operation, the control gate potential VCG is set at 0 V, the drain potential VD is set to a floating, and a high potential, such as 12 V, for example, is applied to the source. In this case, an electron in the floating gate is extracted to the source by a tunnel effect.

The read-out operation is carried out by setting the control gate potential VCG at 5 V, the drain potential VD at 0.8 V and the source potential VS at 0 V respectively. In this case, when the memory data of the memory cell is "0" (that is, the write state), almost no current flows between the source and the drain, and on the other hand, when the memory data is "1" (that is, the erase state), a cell current of about 60 $\mu$A flows between the source and the drain.

For carrying out the erase operation, the control gate potential VCG is set at 0 V, the drain potential VD is set to a floating, and a high potential, such as 12 V, for example, is applied to the source. In this case, an electron in the floating gate is extracted to the source by a tunnel effect.

Figure 8:
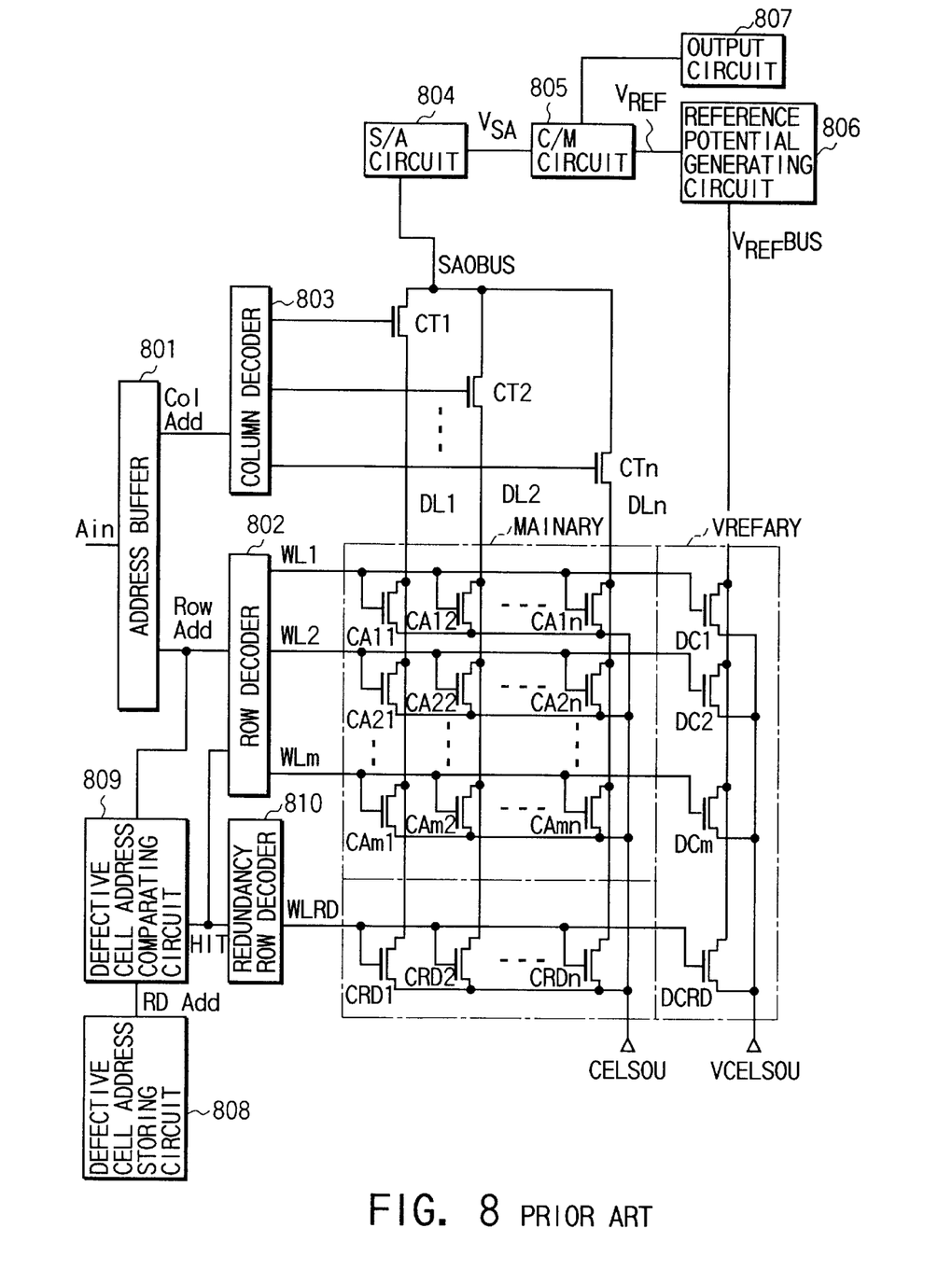
FIG. 8 is a diagram for showing a structure of a conventional non-volatile semiconductor memory cell.

The structure of a non-volatile semiconductor memory device having such a non-volatile transistor as a memory cell is shown in FIG. 8. In FIG. 8, a main memory cell array MAINARY is structured by m×n memory cells CA11 to CAmn disposed in a matrix shape. Each memory cell CAij (i=1, ..., m, j=1, ..., n) is a non-volatile transistor as shown in FIG. 7. The control gate of n memory cells CAk1, ..., CAkn disposed in one row (for example, in a row k) is commonly connected to a corresponding one word line WLk out of m word lines WL1, ..., WLm. Further, the drain of m memory cells Calh, ..., CAmh disposed in one same column (for example, a column h) is commonly connected to one corresponding data line DLh out of n data lines DL1, ..., DLn. The source of each memory cell CAij is supplied with a cell source potential CELSOU which becomes a high potential at the time of erasing and Vss at other times, output from a cell source potential supply circuit not shown. On the other hand, a redundancy memory cell array RDARY is structured by n memory cells CRD1 to CRDn disposed in a matrix shape. The control gate of each memory cell array is commonly connected to a word line WLRD exclusive for the redundancy memory cells.

An address buffer 801 is applied with an external address signal Ain and supplies a row address Row Add and a column address Col Add to a row decoder 802 and a column decoder 803 respectively.

A selection of a word line from the m word lines WL1, ..., WLm is carried out by the row decoder 802 so that one word line corresponding to a row address decoded by the row decoder 802 is selected. On the other hand, a selection of a data line from the n data lines DL1, ..., DLn is carried out by the column decoder 803 so that a transfer gate CTj (j=1, ..., n) connected to one data line DLj (j=1, ..., n) corresponding to a column address decoded by the column decoder 803 is selected. In other words, a data line is selected by turning on a transfer gate connected to a data line corresponding to the column address. Each data line DLj (j=1, ..., n) is connected to a read-out potential generating circuit (hereinafter to be referred to as an S/A circuit) 804 through a corresponding transfer gate CTj. The S/A circuit 804 applies a predetermined potential (for example, 1 V in a memory cell structured by the transistor shown in FIG. 7) to the drain of a selected memory cell in the case of a data reading, and at same time, generates a read-out potential VSA corresponding to the current flowing through the selected memory cell. The read-out potential VSA is the potential VSA1 or VS0 corresponding to the cell data value "1" or "0" and this is input to a current mirror-type amplifying circuit (hereinafter to be referred to as a C/M amplifying circuit) 805.

On the other hand, a dummy cell array VERFARY is structured by m dummy cells DC1 to DCm. A dummy cell DCi (i=1, ..., m) is a non-volatile transistor similar to the memory cell CAij, and its control gate is connected to a corresponding word line WLi, its drain is connected to a dummy data line VREFBUS and a potential VCELSOU is connected to its source. The dummy data line VREFBUS is connected to a reference potential generating circuit 806. The reference potential generating circuit 806 supplies a predetermined potential to the drain of a selected dummy cell through the dummy data line VREFBUS at the time of a data reading and sends the reference potential VREF at the time of the data reading to a C/M amplifying circuit 805. An output circuit 807 outputs data of the selected memory cell to the outside based on the potential sent from the C/M amplifying circuit 805.

When there is a defect in the main memory cell array MAINARY, an address RD Add of the defective cell is stored in a defective cell address storing circuit 808. A row address Row Add sent from the address buffer 801 and the address RD Add of the defective cell stored in the defective cell address storing circuit 808 are applied to a defective cell address comparing circuit 809. When the row address Row Add is a defective cell address RD Add, a defective cell address detection signal HIT is set to H. The defective cell address detection signal HIT is sent to a redundancy row decoder 810 and a row decoder 802. When the defective cell address detection signal HIT becomes H, the redundancy row decoder 810 sets the word line WLRD for the redundancy memory cell to a selective state and the row decoder 802 sets all the word lines WL1 to WLm of the main memory cell to a non-selective state.

Figure 9:
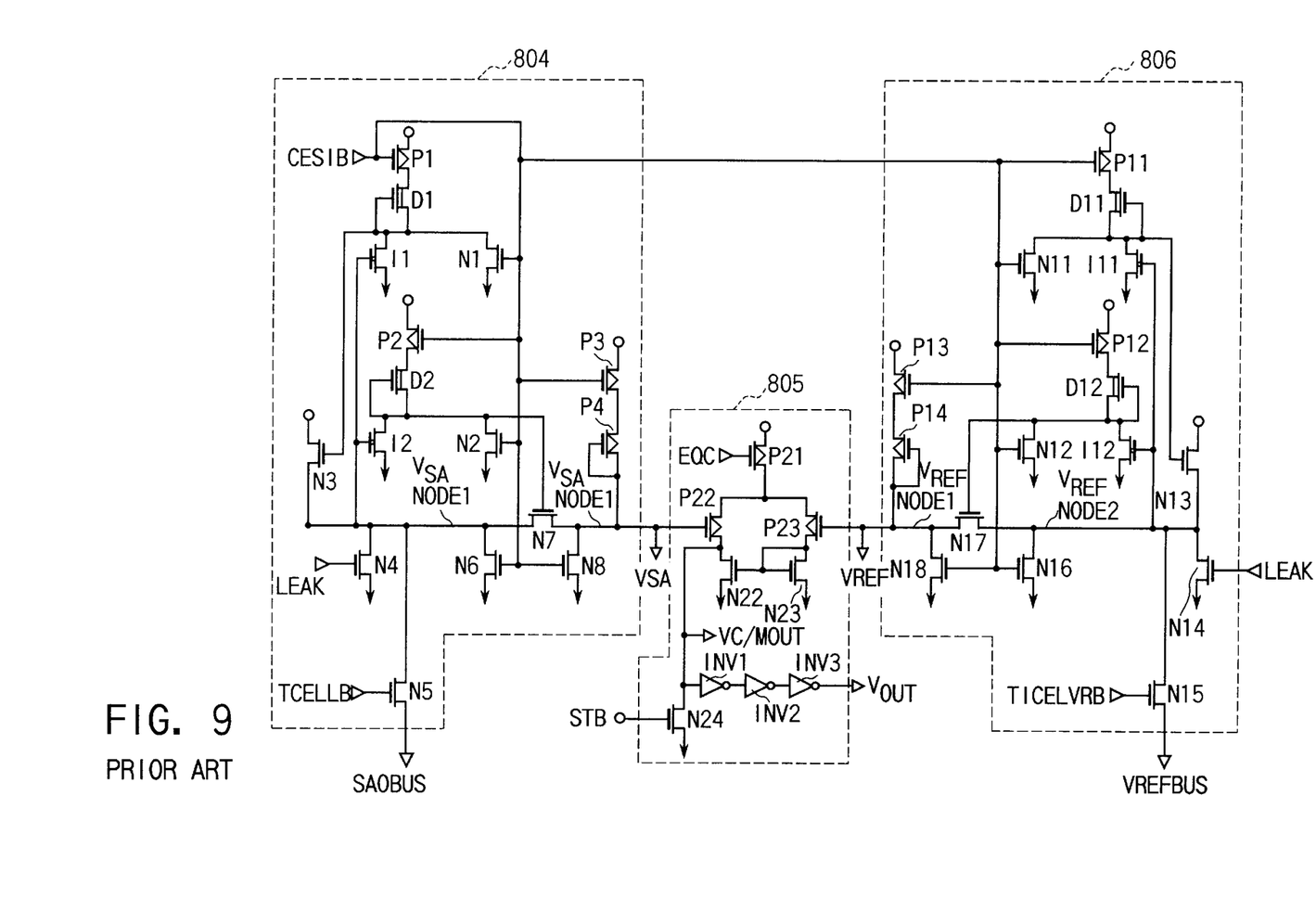
FIG. 9 is a diagram for showing an example of detailed circuitry of a read-out potential generating circuit 804, a reference potential generating circuit 806, a current mirror-type amplifying circuit 805 and equalizing circuit 111 in FIG. 8.

FIG. 9 shows an example of detailed circuits of the read-out potential generating circuit 804, the reference potential generating circuit 806 and the current mirror-type amplifying circuit 805.

In FIG. 9, P1 to P23 denote P-channel type enhancement transistors, D1 to D12 denote N-channel type depression transistors, N1 to N24 denote N-channel type enhancement transistors and I1 to I12 denote N-channel type transistors having threshold values near 0 V.

At first, the operation of the read-out potential generating circuit 804 will be explained briefly. A VSA node 1 of the read-out potential generating circuit 804 is an output terminal of the read-out potential generating circuit, and its potential is applied to an input terminal of the current mirror-type amplifying circuit 805 as the read-out potential VSA. The read-out potential VSA is also connected to a VSA node 2 through a transistor N7. The VSA node 2 is connected to transfer gates CT1 to CTn shown in FIG. 8 through a transistor N5.

At the time of a reading, a signal CESLB becomes "L" and a signal CELLB becomes "H", so that transistors P1 and P3 are turned on to activate the circuit. Consider a case where the data of a selected memory cell of the memory cell array is "0" (write state). In this case, no current flows to the memory cell, as described above, and a potential is applied to the VSA node 1 through the transistors P3 and P4 to become VSA0 (for example, 3 V). When the data of a selected memory cell of the memory cell array is "1" (the erase state), a current of approximately 60 $\mu$A flows to the memory cell as described above. In this case, the potential of the VSA node 1 is determined by a voltage divided ratio of a load transistor P4 to the memory cell to become VSA1 (for example, 1 V).

On the other hand, series-connected transistors P1, D1 and I1 and P2, D2 and I2 monitor the potential of the VSA node 2 and determine gate potentials of transistors N3 and N7 respectively. During a read-out operation, the VSA node 2 is charged via the transistor N3 and the transistors P3, P4 and N7, and the potential is held at a constant level by the transistors N3 and N7. Further, during the read-out operation, the transistor N5 and the selected transfer gate are turned on, so that a suitable potential (for example, 0.8 V) is applied to a drain potential VD of the selected memory cell.

The reference potential generating circuit 806 will be explained next. The reference potential generating circuit 806 is a circuit having the same structure as the read-out potential generating circuit 804, and P11, for example, of the reference potential generating circuit 806 corresponds to the transistor P1 of the read-out potential generating circuit 804. A VREF node 1 of the reference potential generating circuit 806 is an output terminal of the reference potential generating circuit, and its potential is applied to an input terminal of the current mirror amplifying circuit 805 as the reference potential VREF. The reference potential VREF is connected to the VREF node 2 through a transistor N17. The VREF node 2 is connected to the dummy data line VREFBUS through a transistor N15.

During a read-out operation, a predetermined potential is supplied to the dummy data line VREFBUS as is the case with the read-out potential generating circuit 804. Since the dummy cells DC1 to DCm are the cells in the erase state, a cell current of approximately 60 $\mu$A flows during the write period. The reference potential VREF in this case is determined by a divided voltage ratio of a load transistor P14 to a selected dummy cell. The reference potential VREF needs to be takes as an intermediate potential between the read-out potential VSA0 at the time when data "0" is being stored in the memory cell and the read-out potential VSA1 at the time when data "1" is being stored. For this purpose, a transistor with a larger current quantity than that of the transistor P4 corresponding to the read-out potential generating circuit 804 is used for the load transistor P14 of the reference potential generating circuit 806.

The current mirror amplifying circuit 805 has transistors P21, N22, P23, N23 and P22. The output potential VSA of the read-out generating circuit 804 is applied to the gate terminal of the transistor P22, and the output potential VREF of the reference potential generating circuit 806 is applied to the gate terminal of transistor P23. The transistors N22 and N23 have an equal potential between the gate and the source, and currents which flow through these transistors respectively becomes equal. Accordingly, a differential between VSA and VREF is amplified and output to an output potential VC/MOUT of the current mirror amplifying circuit 805 by differential pair transistors P22 and P23. For example, when the data stored in the selected memory cell of the memory cell array is "0", VSA becomes 3 V and when the reference potential VREF becomes 2 V, a differential between these two potentials is amplified and an L level is output to VC/MOUT. Similarly, when the data stored in the selected memory cell of the memory cell array is "1", VSA becomes 1 V, which is compared with the reference potential VREF (2 V) and an H level is output to VC/MOUT. Through a buffer circuit structured by inverters INV1 to INV3, when the data stored in the selected memory cell of the memory cell array is "0" and when the data stored in the selected memory cell of the memory cell array is "1", the signals of VC/MOUT are converted to an output signal VOUT of an H level and an L level respectively and they are output.

According to the above-described prior-art EEPROM, after an address signal Ain has been input, when the address signal Ain is found to be a defective cell address, a redundancy word line which replaces the defective word line is selected. However, as compared with the case when a normal word line has been selected, the following means are additionally required until the potential of the redundancy word line has risen sufficiently. At first, the input row address Rowadd and the defective cell address RD Add stored in the defective cell address storing circuit 808 are compared with each other by the defective cell address comparing circuit 809. When all the bits of these addresses coincide, a defective cell address detection signal HIT is sent out, and the redundancy row decoder having received this defective cell address detection signal HIT sets the redundancy word line to a selective state. In this case, since the defective cell address comparing circuit 809 has a multi-stage logical comparison circuit, it takes a relatively long time until the defective cell address detection signal HIT becomes firm. In other words, after an address signal has been input, the time required for a redundancy word line is selected and its read-out potential VSA and the reference potential VREF are input to the current mirror amplifying circuit 805 is relatively longer than the time required when a normal word line has been selected. Therefore, this has been an interference to the speed-up of the reading of the EEPROM.

BRIEF SUMMARY OF THE INVENTION

With a view to obviating the above-described prior-art problems, it is an object of the present invention to provide a semiconductor memory device of a type for replacing a defective cell within a main memory cell array with a redundancy memory cell, which can reduce the time required for a read-out to thereby achieve an increase in the read-out time.

According to a semiconductor memory device of the present invention, in a data read-out section having a read-out potential node to which a read-out potential of an address-assigned memory cell is applied and a reference potential node to which a reference potential is applied, for comparing a potential difference between the read-out potential node and the reference potential node, to detect whether data stored in the memory cell is "0" or "1", if the assigned memory cell is a defective cell and a redundancy cell which replaces this defective cell is to be selected, the read-out node and the reference potential node are short-circuited for a predetermined period of time to obtain the same potential and thereafter both nodes are separated, and at the time when both nodes have shifted to the read-out potential and the reference potential respectively, whether the read-out data is "0" or "1" is detected. As described above, by once setting the read-out potential node and the reference potential node to the same level, that is, by setting the potential to a certain intermediate potential between the read-out potential and the reference potential, it becomes possible to reduce the time required for both nodes to be shifted to their respective potentials. Accordingly, it is possible to shorten the delay in the rising of the defective word line when the data of the redundancy cell is read out.

Further, by combining the present invention with an ADT circuit, it becomes possible to match the high-speed read-out at the time of an address transition.

According to an aspect of the present invention, there is provided a semiconductor memory device, comprising: a first memory cell array including a plurality of memory cells laid out in a matrix shape; a second memory cell array including memory cells to be allocated to a defective memory cell when the defective memory cell exists; an address assigning section for assigning an optical memory cell out of the first and second memory cell arrays; and a data read-out section for comparing a potential of a read-out potential node, of which potential is determined based on a data stored in the assigned memory cell, with a potential of a reference potential node having a reference potential, and for determining a read-out data, wherein the data read-out section short-circuits the read-out potential node with the reference potential node so that both potentials are at the same potential, when a memory cell of the second memory cell array has been assigned. The read-out potential node may be connected to a memory cell selected from the first and second memory cell arrays, a potential thereof may be determined by a current flowing through the memory cell, the reference potential node may be connected to a dummy cell in the first and second memory cell arrays, and a potential thereof may be determined by a current flowing through the dummy cell. The read-out potential node and the reference potential node may not be equalized during a verification read-out operation.

According to another aspect of the present invention, there is provided a semiconductor memory device, comprising: a memory cell array including word lines, redundancy word lines to be allocated to a defective word line detected out of the word lines, bit lines intersecting the word lines and the redundancy word lines, and dummy bit lines to which dummy cells are connected; a redundancy selective control section for outputting a defective cell address detection signal and setting a corresponding one of the redundancy word lines to a selective state, when the defective word line is assigned by a cell address signal; a read-out potential generating circuit, connected to a selected one of the bit lines, for sending out a read-out potential (VSA) based on data stored in a memory cell to a read-out potential (VSA) node; a reference potential generating circuit connected to the dummy bit lines and for sending out a reference potential (VREF) to a reference potential (VREF) node; and a comparing and amplifying section for comparing the read-out potential (VSA) with the reference potential (VREF), outputting data of 0 or 1 by amplifying a result of the comparison, and specifying data stored in a memory cell, wherein the semiconductor memory device further includes an equalizing section for equalizing the read-out potential (VSA) node and the reference potential (VREF) node of the comparing and amplifying section only when the defective cell address detection signal is output. The equalizing section may continue an equalization operation until the redundancy word line rises. The equalizing section may continue an equalization operation until the word line rises when the cell address transition signal has been received and may continue an equalization operation until the redundancy word line rises when the defective cell address detection signal has been received. The equalizing section may not carry out an equalization operation during a period of a verification reading.

According to a further aspect of the present invention, there is provided a semiconductor memory device, comprising: a memory cell array including word lines, redundancy word lines to be allocated to a defective word line detected out of the word lines, bit lines intersecting the word lines and the redundancy word lines, and dummy bit lines to which dummy cells are connected; an address transition detecting section for detecting a change in an input cell address signal and for sending out a cell address transition detection signal; a redundancy selective control section for outputting a defective cell address detection signal and setting a corresponding one of the redundancy word lines to a selective state, when the defective word line is assigned by an input cell address signal; a read-out potential generating circuit, connected to a selected one of the bit lines, for sending out a read-out potential (VSA) based on data stored in a memory cell to a read-out potential (VSA) node; a reference potential generating circuit connected to the dummy bit lines and for sending out a reference potential (VREF) to a reference potential (VREF) node; and a comparing and amplifying section for comparing the read-out potential (VSA) with the reference potential (VREF), outputting data of 0 or 1 by amplifying a result of the comparison, and specifying data stored in a memory cell, wherein the semiconductor memory device further includes an equalizing section for equalizing the read-out potential (VSA) node and the reference potential (VREF) node of the comparing and amplifying section when the cell address transition signal is output or when the defective cell address detection signal is output. The equalizing section may not carry out an equalization operation during a period of a verification reading.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be explained below with reference to the drawings.

Figure 1:
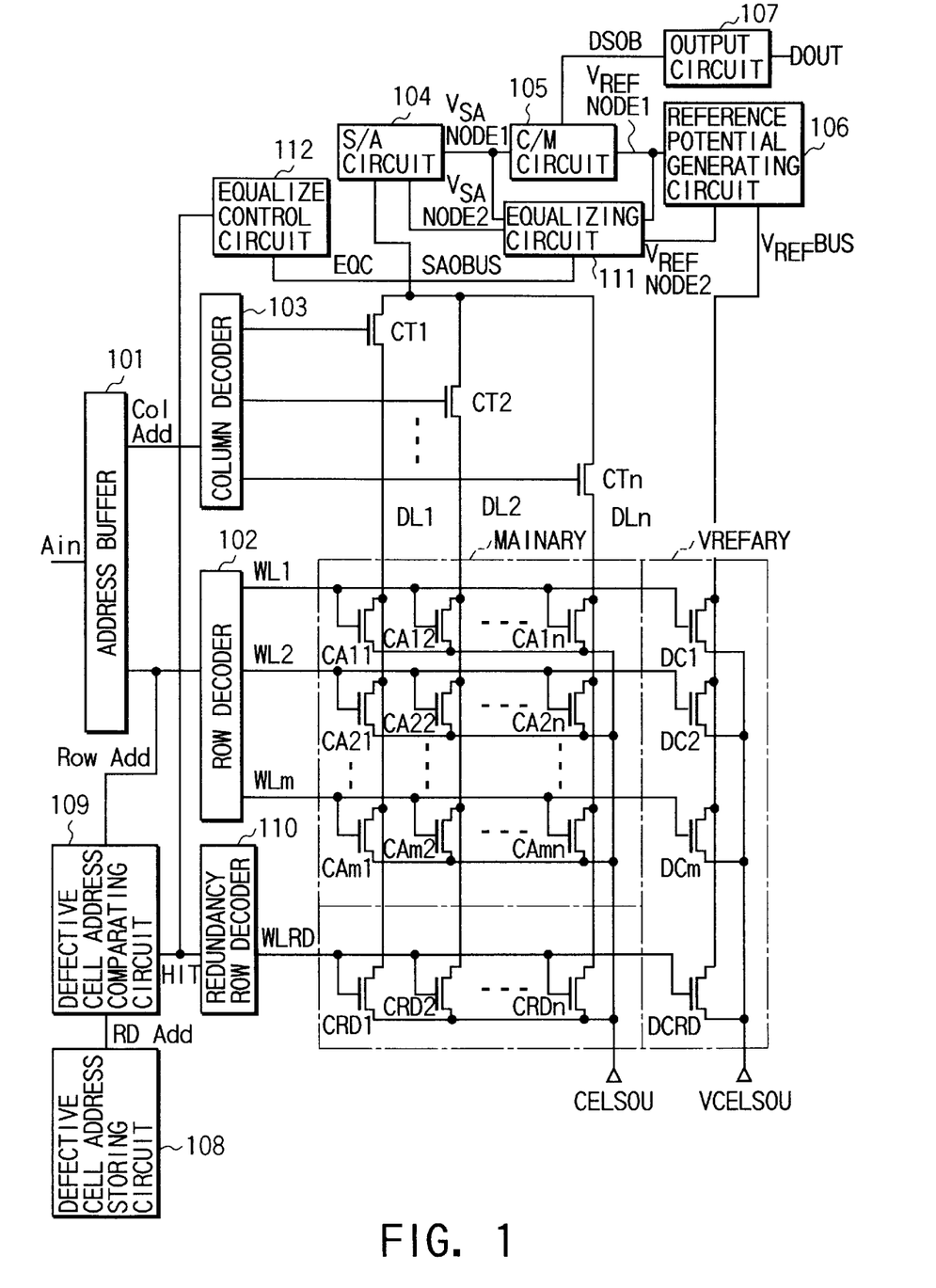
FIG. 1 is a diagram for showing a structure of a non-volatile semiconductor memory device according to a first embodiment of the present invention.

FIG. 1 shows a structure of a non-volatile semiconductor memory device having a non-volatile transistor used as a memory cell according to a first embodiment of the present invention. The circuit structures and operations of an address buffer 101, a row decoder 102, a column decoder 103, a read-out potential generating circuit 104, a current mirror-type amplifying circuit 105, a reference potential generating circuit 106, an output circuit 107, a defective cell address storing circuit 108, a defective cell address comparing circuit 109 and a redundancy row decoder 110 respectively are similar to those of the non-volatile semiconductor memory device according to the prior-art technique as explained with reference to FIGS. 7 to 9. The non-volatile semiconductor memory device of the present embodiment is different from the above-described prior-art non-volatile semiconductor memory device in that, an equalizing circuit 111 for connecting the VSA node 1 with the VREF 1 and connecting the VSA node 2 with the VREF node 2 and for setting their respective potentials to be equal, and an equalize control circuit 112 for controlling the equalize operation are added.

The operation of the first embodiment will be explained below. Upon receiving an external address Ain, the address buffer 101 sends a column address Col Add to the column decoder 103 and a row address Row Add to the row decoder 102 respectively as internal cell address signals. On the other hand, the row address Row Add is also input to the defective cell address comparing circuit 109. Upon receiving the column address Col Add, the column decoder 103 selectively turns on one transfer gate CTi out of the transfer gates CT1 to CTn and connects the data line DLi to the read-out potential generating circuit or the sense amplifying (S/A) circuit 104. Upon receiving the row address Row Add, the row decoder 102 selects one word line WLj out of the word lines WL1, . . . , WLm, so that a memory cell CAij to be connected to the data line DLi and the word line WLj is selected.

When a defective cell is found in the main memory cell array MAINARY during a defective cell detecting operation, the address RD Add of the defective memory cell is stored in the defective cell address storing circuit 108. While the row address Row Add is applied to the row decoder 102, this is also applied to the defective cell address comparing circuit 109 so that this row address is compared with the contents of the defective cell address storing circuit 108. When the input row address Row Add coincides with the defective memory cell address RD Add, the defective cell address comparing circuit 109 sends the defective cell address detection signal HIT to the redundancy row decoder 110, the row decoder 102 and the equalize control circuit 112 respectively. Upon receiving the defective cell address detection signal HIT, the redundancy row decoder 110 sets the redundancy word line WLRD to the selective state and the row decoder sets all the word lines WL1 to WLm to the non-selective state.

The equalize control circuit 112 is a pulse generating circuit, which sends a pulse signal EQC that becomes an H level for a predetermined period of time, upon receiving the defective cell address detection signal HIT.

Figure 2:
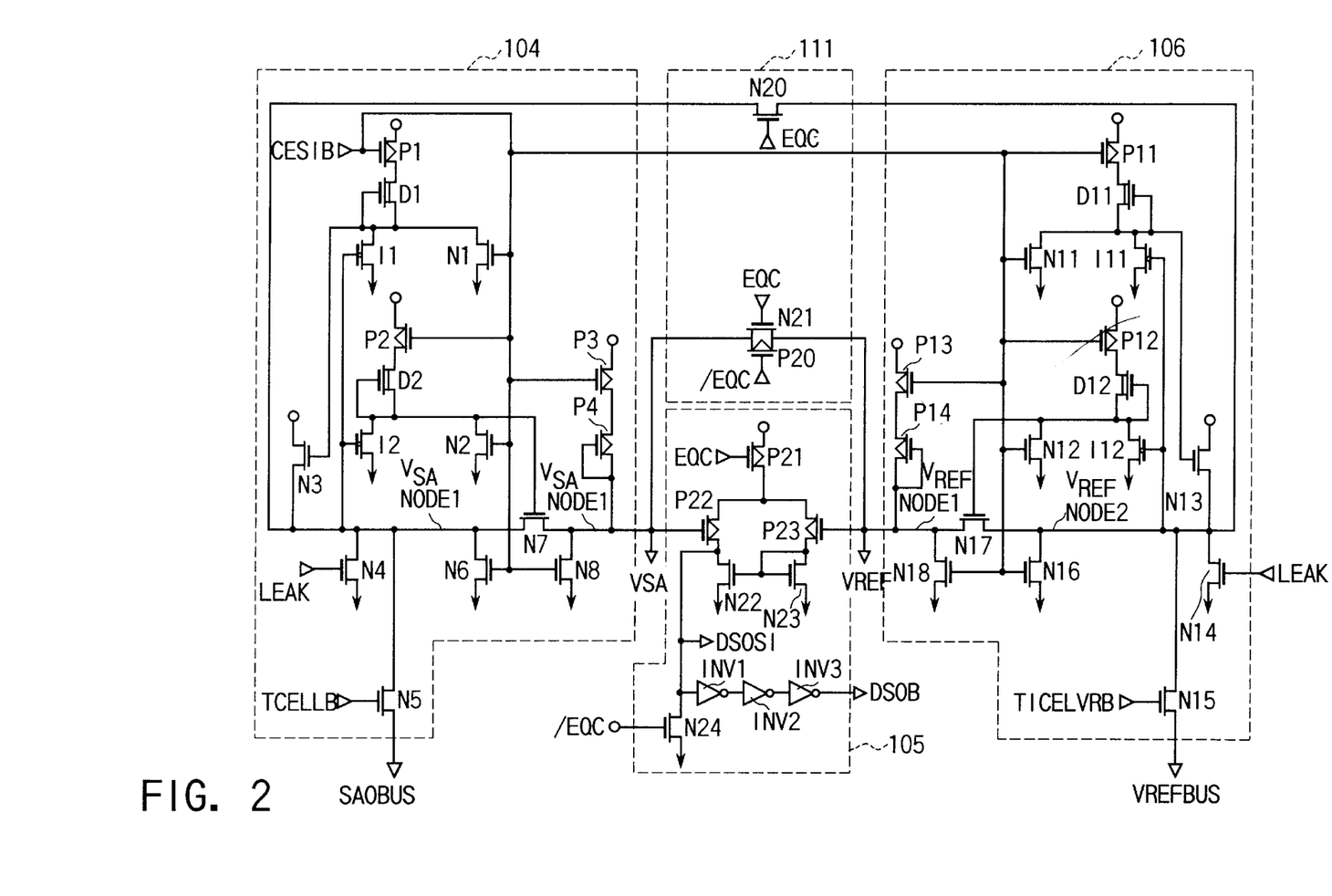
FIG. 2 is a diagram for showing an example of detailed circuitry of a read-out potential generating circuit 104, a reference potential generating circuit 106, a current mirror-type amplifying circuit 105 and an equalizing circuit 111.

FIG. 2 shows an example of the detailed circuit structures of the read-out potential generating circuit 104, the reference potential generating circuit 106, the current mirror-type amplifying circuit 105 and the equalizing circuit 111.

In FIG. 2, the circuit structures and operations of the read-out potential generating circuit 104, the reference potential generating circuit 106 and the current mirror-type amplifying circuit 105 are the same as those of the read-out potential generating circuit 804, the reference potential generating circuit 806 and the current mirror-type amplifying circuit 805 shown in FIG. 9, and therefore, their explanation will be omitted here.

The equalizing circuit 111 which is added to the structure of the present invention is structured by an N-channel transistor N20 for turning on and off the connection between the VSA node 2 of the read-out potential generating circuit 104 and the VREF node 2 of the reference potential generating circuit 106 and an N-channel transistor N21 and a P-channel transistor P20 for turning on and off the connection between the VSA node 1 of the read-out potential generating circuit 104 and the VREF node 1 of the reference potential generating circuit 106. The pulse signal EQC sent from the equalize control circuit 112 is applied to the gates of the transistors N20 and N21, and an inverted signal /EQC of EQC is applied to the gate of the transistor P20. The pulse signal EQC becomes an L level when the memory cells CA11 to CAmn of the main memory cell array MAINARY are read out, so that the VSA node 1 and the VREF node 1 and the VSA node 2 and the VREF node 2 are not equalized respectively. On the other hand, when the memory cells CRD1 to CRDn of the redundancy memory cell array RDARY are read out, the pulse signal EQC becomes an H level for a predetermined period of time, so that the VSA node 1 and the VREF node 1 and the VSA node 2 and the VREF node 2 are equalized respectively.

At the time of a data reading, the read-out potential generating circuit 104 applies a predetermined potential (for example, 0.8 V) to the drain of a selected memory cell and, at the same time, generates the read-out potential VSA corresponding to the current flowing through the selected memory cell. As the read-out potentials VSA, the potentials VSA1 and VSA0 are sent to the current mirror amplifying circuit 105 corresponding to the data values "1" and "0" respectively. On the other hand, the reference potential generating circuit 106 applies a predetermined drain potential (for example, 0.8 V) to the drain of the dummy cells DC1 to DCn and DCRD and, at the same time, generates the reference potential VREF and sends this to the current mirror amplifying circuit 105. The current mirror amplifying circuit 105 compares the input potential VSA with VREF, amplifies the differential between the two and outputs an output DSOB corresponding to the data stored in the selected memory cell.

When the main memory cell (CA11 to CAmn) is assigned and read out, the pulse signal EQC becomes "L" and the inverse pulse signal /EQC becomes "H", and the equalizing circuit 111 does not equalize the VSA node 1 and the VSA node 2 and the VREF node 2 and the VREF node 2 respectively. In this case, the potential VREF of the VREF node 1 becomes constant and the potential VSA of the VSA node 1 changes according to the current flowing through the selected memory cell.

On the other hand, when the redundancy memory cell is read out, the row address Row Add coincides with the address RD Add of the defective memory cell and the HIT signal becomes "H", so that the pulse signal EQC becomes "H" for a predetermined period of time and /EQC becomes "L" for a predetermined period of time and the equalizing circuit 111 equalizes the VSA node 1 and the VREF node 1 and the VSA node 2 and the VREF node 2 respectively. The timing for setting the pulse signal EQC to "L" and stopping the equalization is set at a time which is required for the potential of the redundancy word line WLRD to be higher than the threshold value of the memory cell for storing the "1" data.

Figure 3A:
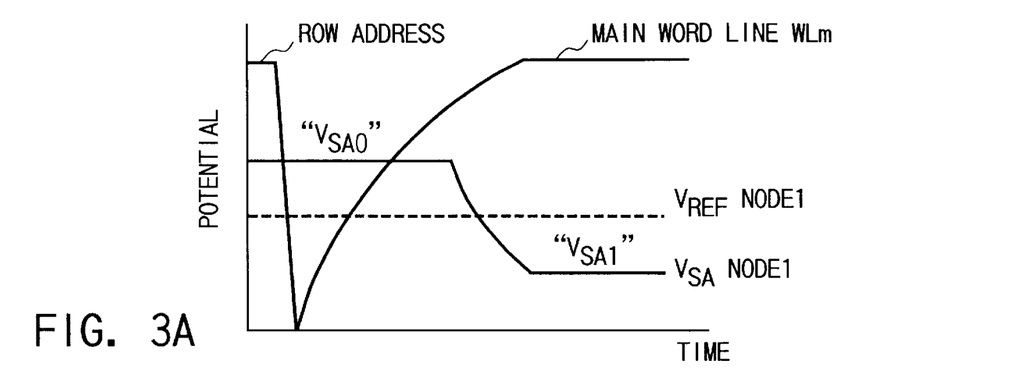
FIGS. 3A and 3B are diagrams each for showing a change in the potential of each section at the time of a read-out in the non-volatile semiconductor memory device according to the first embodiment of the present invention.
Figure 3B:
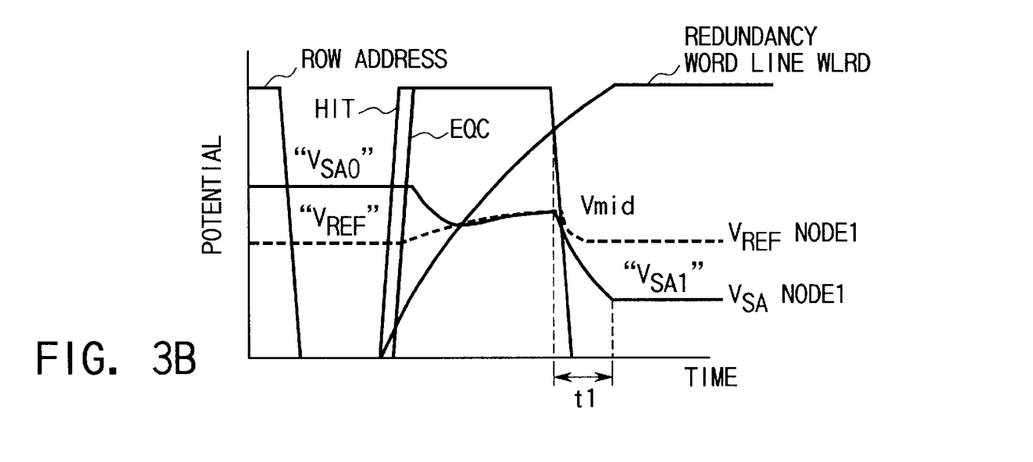

FIGS. 3A and 3B show the state of the potential of each section when the memory cell storing the "1" data is read out after the memory cell which stores the "0" data is read out, in the first embodiment of the present invention. FIG. 3A shows the case when the main memory cell is read out, and FIG. 3B shows the case when the redundancy memory cell is read out.

Referring to FIG. 3A, when the row address has changed, the selected word line WLm rises. When the potential of the selected word line WLm reaches a threshold value, a current flow via the selected memory cell and the potential of the VSA node 1 changes from VSA0 to VSA1. Referring to FIG. 3B, when the row address has changed, the fact that the selected word line is the redundant word line is detected and the defective cell address detection signal HIT rises. Upon receiving the HIT signal, the redundancy word line WLRD starts rising. It takes a relatively long time until the defective cell address detection signal HIT rises after the row address has been received, as described in the prior-art technique with reference to FIGS. 7 to 9, the redundancy word line WLRD rises later than the word line WLm of the main memory cell as shown in FIG. 3B. Upon receiving the HIT signal, the equalize signal EQC becomes "H" and the VSA node 1 and the VREF node 1 are equalized to become an intermediate potential Vmid between the read-out potential VSA0 and the reference potential VREF. At the point of time when the potential of the redundancy word line WLRD becomes higher than the threshold value of the memory cell storing the "1" data, the pulse signal EQC becomes "L" and the equalization of the VSA node 1 and the VRED node 1 finishes so that the potentials of the VSA node 1 and the VREF node 1 shift from Vmid to predetermined potentials respectively.

Figure 4:
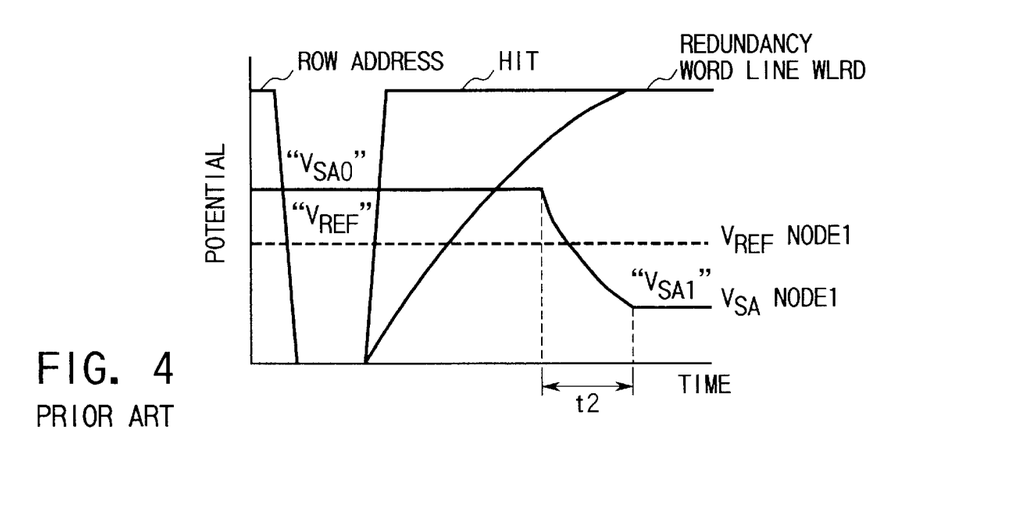
FIG. 4 is a diagram for showing a change in potential of each section at a read-out time according to a conventional non-volatile semiconductor memory device.

FIG. 4 shows an example of the potential change according to the prior-art technique which corresponds to the potential change of the embodiment of the present invention shown in FIG. 3. FIG. 4 of the prior-art example shows a case where equalization is not carried out when the redundancy memory cell is selected. In FIG. 3B and FIG. 4, the time taken from when a current starts flowing to the selected memory cell to when the potential of the VSA node 1 becomes firm is expressed by t1 and t2 respectively. As is clear from FIG. 3B and FIG. 4, t2 is the time required for the VSA node 1 to change from the potential VSA0 to VSA1 and t1 is the time required for the VSA node 1 to change from the potential Vmid to VSA1. In this case, the following relation exists t1<t2.

Accordingly, by carrying out the equalization, the time required to make firm the potential of the VSA node 1 can be reduced from t2 to t1.

Further, during the period t2 in FIG. 4, the relationship of size between the potential of the VSA node 1 and the potential of the VREF node 1 is reversed. Accordingly, in the current mirror circuit 105 which has the potential of the VSA node 1 and the potential of the VREF node 1 as inputs, the time taken until the output signal "H" is sent out is delayed in the circuit operation. On the other hand, during the period t1 in FIG. 3B, the potential of the VSA node 1 can be set always lower than the potential of the VREF node 1. Therefore, the current mirror circuit 105 can quickly send the output signal "H" so that the time required for firming up the read-out signal can be reduced.

With the above-described structure, the delay in the rise of the redundancy word line WLRD can be cancelled by reducing the time required from when the redundancy word line WLRD starts rising till when the read-out signal is sent out. Thus, even if there is a defective cell in the main memory cell array, it becomes possible to prevent a deterioration in the total read-out time of the semiconductor memory device.

Figure 5:
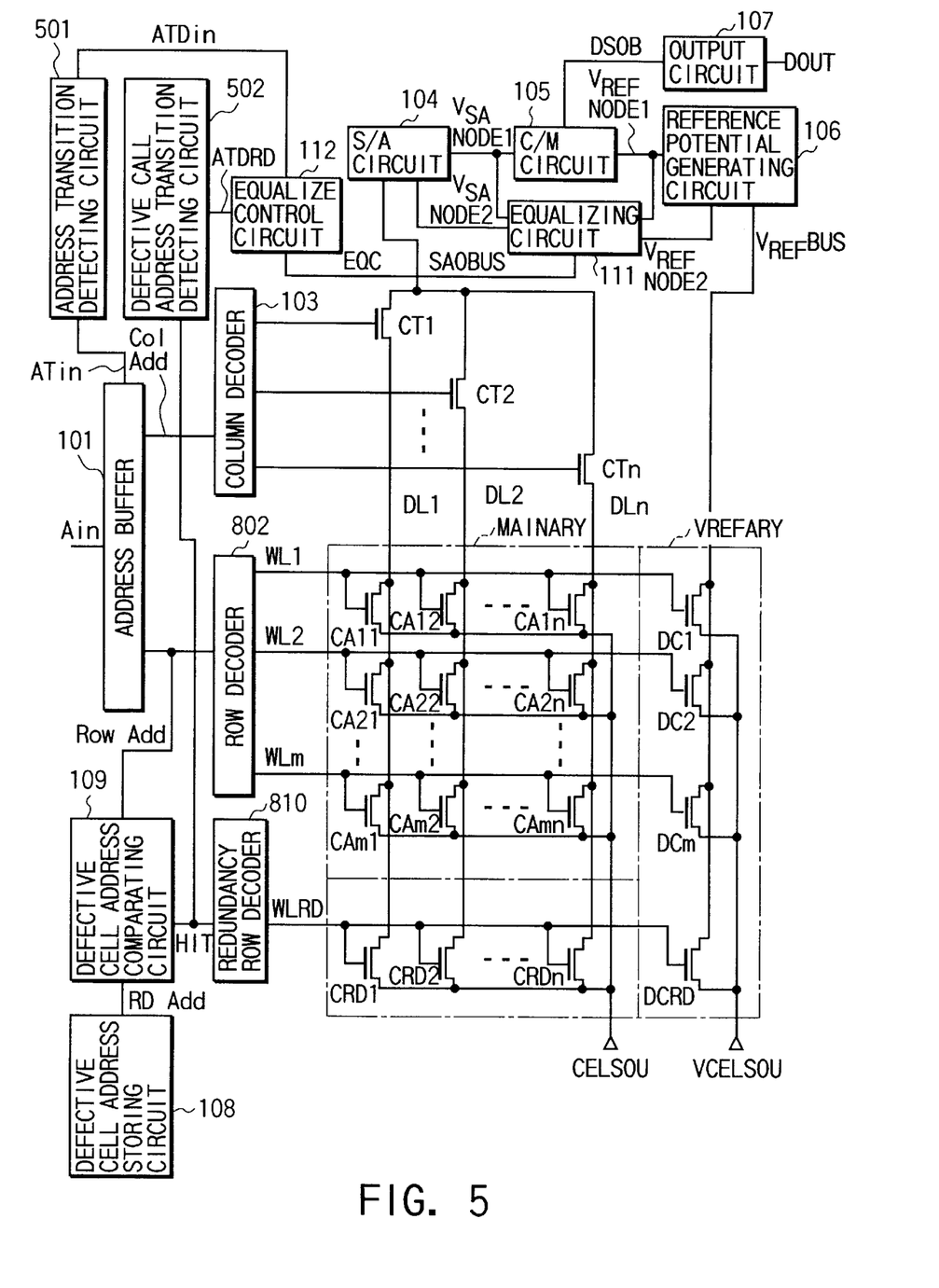
FIG. 5 is a diagram for showing a structure of a non-volatile semiconductor memory device according to a second embodiment of the present invention.

The structure of a non-volatile semiconductor memory device using a non-volatile transistor relating to a second embodiment of the present invention as a memory cell is shown in FIG. 5. The present embodiment has a structure having an address transition detecting circuit 501 and a defective cell address transition detecting circuit 502 added to the structure of the non-volatile semiconductor memory device of the first embodiment of the present invention shown in FIG. 1. Structural elements corresponding to those in FIG. 1 are attached with the same reference numbers.

The operation of the second embodiment will be explained below. The address transition detecting circuit 501 having received an internal cell address ATin sent from the address buffer 101 detects the transition of the cell address and sends an address transition detection signal ATDin to the equalize control circuit 112 in a pulse shape. In response to the rising of the address transition detection signal ATDin, the equalize control circuit 112 sends the pulse signal EQC which becomes an H level for a predetermined period of time. The equalizing circuit 111 having received the pulse signal EQC equalizes the VSA node 1 and the VREF node 1 and the VSA node 2 and the VREF node 2 respectively during the period while the pulse signal EQC is "H", in the manner similar to that in the first embodiment. In this case, the period of "H" is set to the period required for a selected word line potential to rise to a threshold value voltage of the memory cell storing the "1" data.

Further, even if other internal cell address ATin signal has shifted during an equalization and when other address transition detection signal ATDin has risen, the equalization operation ends after a predetermined period of time since the declining of the final ATDin.

On the other hand, when a defective cell address has been selected, the defective cell address transition detecting circuit 502 having received the defective cell address detection signal HIT detects the transition of the defective cell address and sends the defective cell address transition detection signal ATDRD to the equalize control circuit 112 in a pulse shape. In this case, the internal cell address ATin also shifts. Since the equalize control circuit 112 is applied with the address transition detection signal ATDin prior to the defective cell address transition detection signal ATDRD, the pulse signal EQC rises by the ATDin and declines after a predetermined period of time since the rise of ATDTD. Therefore, at the time of reading out the redundancy memory cell as well, the equalization ends after the redundancy word line WLRD has risen to the threshold value voltage of the memory cell storing the "1" data.

As explained above, according to the second embodiment, not only at the time of reading out the redundancy memory cell, but also at the time of reading out the main memory cell as well, equalization is carried out to achieve a high-speed reading when the internal cell address has shifted.

Figure 6A:
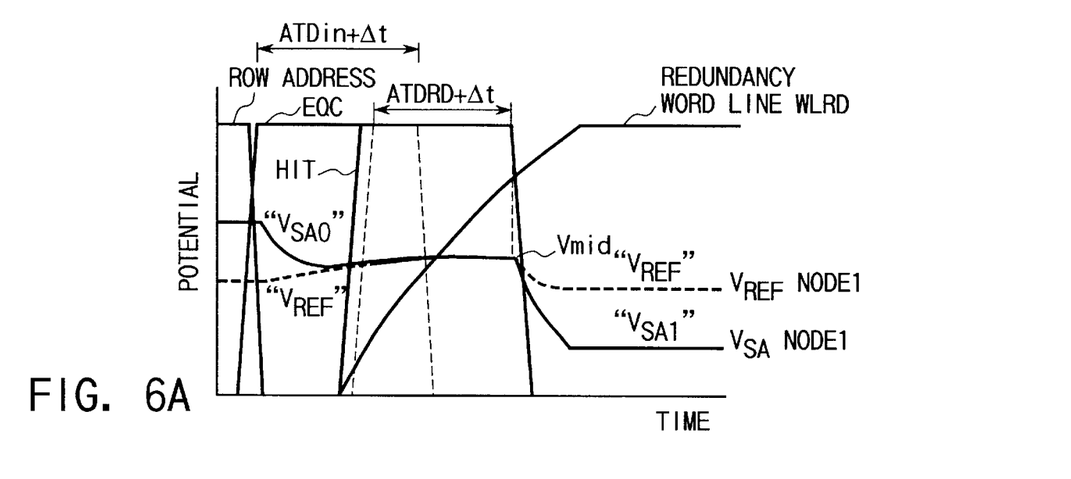
FIGS. 6A and 6B are diagrams each for showing a change in the potential of each section at the time of a read-out in the non-volatile semiconductor memory device according to the second embodiment of the present invention.
Figure 6B:
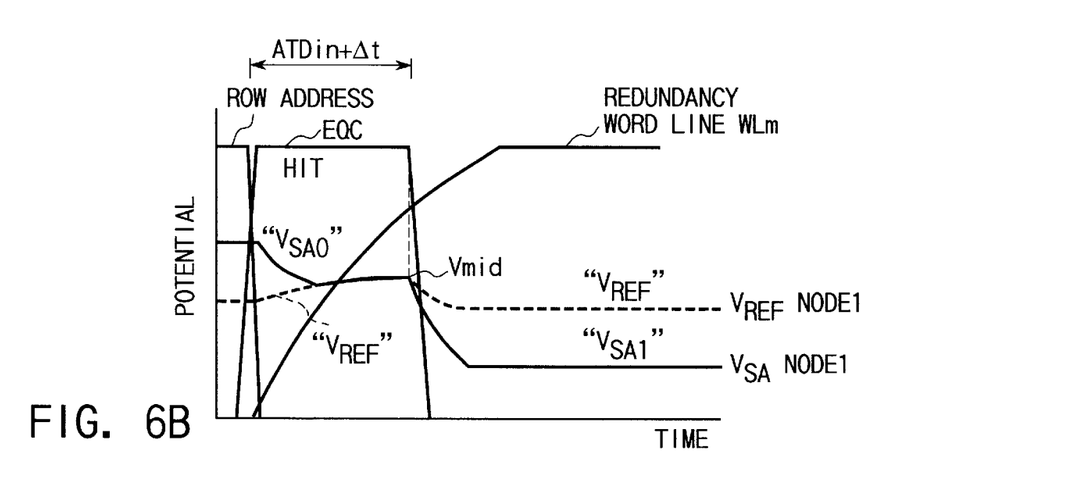

FIGS. 6A and 6B show the state of the change in the potential at each section when the memory cell storing the "1" data is read out after the memory cell storing the "0" data has been read out in the second embodiment of the present invention. FIG. 6A shows the case when the main memory cell is read out, and FIG. 6B shows the case when the redundancy memory cell is read out.

Referring to FIG. 6A, when the row address has changed, the selected word line WLm rises. Further, since the internal cell address signal ATin changes prior to the change of the row address, the pulse signal ATDin is sent out from the address transition detecting circuit 501 corresponding to this change. When the equalize control circuit 112 has received the ATDin, the EQC signal becomes "H" for a predetermined period of time and the VSA node 1 and the VREF node 1 are equalized to have the intermediate potential Vmid between the read-out potential VSA0 and the reference potential VREF. At the time when the potential of the word line WLm becomes higher than the threshold value of the memory cell storing the "1" data, the EQC signal becomes "L" and the equalization of the VSA node 1 and the VREF node 1 finishes. Then, the potentials of the VSA node 1 and the VREF node 1 shift from Vmid to predetermined potentials respectively. As explained above, since the equalization is carried out at the time of reading out the main memory cell as well in the present embodiment, the time required for firming up the read-out data is shortened as compared with the time required for reading out the main memory cell in the first embodiment (refer to FIG. 3A). Referring to FIG. 6B, since the internal cell address signal ATin also changes prior to the change of the row address, the equalization of the VSA node 1 and the VREF node 1 is started in the manner similar to that of the case of FIG. 6A. On the other hand, the defective cell address transition detecting circuit 502 detects the transition of the defective cell address detection signal HIT and sends out the pulse signal ATDRD. When the equalize control circuit 112 has received the pulse signal ATDRD, its EQC signal becomes "H" for a predetermined period of time and the equalization operation of the VSA node 1 and the VREF node 1 is continued. At the time when the potential of the redundancy word line WLRD has become higher than the threshold value of the memory cell storing the "1" data, the pulse signal EQC becomes "L" and the equalization of the VSA node 1 and the VREF node 1 finishes.

When the equalization is finished after a predetermined period of time since the rise of the address transition detection signal ATDin at the time of reading out the redundancy memory cell in the manner similar to that at the time of reading out the main memory cell, the VSA level becomes higher than the VREF level because the potential of the redundancy word line WLRD has not risen to the threshold value of the memory cell storing the "1" data. Therefore, an attempt to read out the "0" data results in a malfunction. On the other hand, according to the present embodiment, since the end of the equalization is determined in response to the transition of the defective cell address detection signal HIT during the equalization when the redundancy memory cell is to be selected, this kind of malfunction does not occur. The non-volatile semiconductor apparatus having the so-called ATD circuit carries out an equalization according to the transition of the internal cell address as shown in FIG. 6A. In order to prevent the above-described read-out malfunction of the redundancy word line, the equalization time is set longer. However, since the equalization time is unnecessarily longer at the time of reading out the main memory cell, this has been an interference to the speed-up of the read-out time. According to the second embodiment of the present invention, however, since the equalization time is set by making a decision whether the memory cell to be read out is defective or not, it is possible to separate between the equalization time for reading out the main memory cell and the equalization time for reading out the redundancy memory cell. Therefore, the time required for reading out the main memory cell can be shortened, with a result that the overall read-out time of the non-volatile semiconductor memory device can also be shortened.

Further, in a non-volatile semiconductor memory device having an auto-verification function, a data re-writing or verification is carried out inside the semiconductor chip. Therefore, there is no time constraint in this operation. Accordingly, a complex operation of an equalization is not necessary during a verification operation.

According to the non-volatile semiconductor memory device of the present invention, as is clear from the above-described explanation with reference to the drawings, the speed of read-out time can be increased by shortening the read-out time of the redundancy memory cell.

Moreover, in a non-volatile semiconductor memory cell having the ATD circuit, the speed of read-out time can be increased by separating the main memory cell read-out time from the redundancy memory cell read-out time and also by shortening the respective read-out times.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device, comprising:
   a first memory cell array including a plurality of memory cells laid out in a matrix shape;

a second memory cell array including memory cells to be allocated to a defective memory cell when said defective memory cell exists;

an address assigning section for assigning an optional memory cell out of said first and second memory cell arrays; and a data read-out section for comparing a potential of a read-out potential node, of which potential is determined based on a data stored in said assigned memory cell, with a potential of a reference potential node having a reference potential, and for determining a read-out data, wherein said data read-out section short-circuits said read-out potential node with said reference potential node so that both potentials are at the same potential, when a memory cell of said second memory cell array has been assigned.

2. A semiconductor memory device according to claim 1, wherein said read-out potential node is connected to a memory cell selected from said first and second memory cell arrays, a potential thereof is determined by a current flowing through said memory cell, said reference potential node is connected to a dummy cell in said first and second memory cell arrays, and a potential thereof is determined by a current flowing through said dummy cell.

3. A semiconductor memory device according to claim 1, wherein said read-out potential node and said reference potential node are not equalized during a verification read-out operation.

4. A semiconductor memory device, comprising:

a memory cell array including word lines, redundancy word lines to be allocated to a defective word line detected out of said word lines, bit lines intersecting said word lines and said redundancy word lines, and dummy bit lines to which dummy cells are connected;

a redundancy selective control section for outputting a defective cell address detection signal and setting a corresponding one of said redundancy word lines to a selective state, when said defective word line is assigned by a cell address signal;

a read-out potential generating circuit, connected to a selected one of said bit lines, for sending out a read-out potential (VSA) based on data stored in a memory cell to a read-out potential (VSA) node;

a reference potential generating circuit connected to said dummy bit lines and for sending out a reference potential (VREF) to a reference potential (VREF) node; and a comparing and amplifying section for comparing said read-out potential (VSA) with said reference potential (VREF), outputting data of 0 or 1 by amplifying a result of said comparison, and specifying data stored in a memory cell, wherein said semiconductor memory device further includes an equalizing section for equalizing the read-out potential (VSA) node and the reference potential (VREF) node of said comparing and amplifying section only when said defective cell address detection signal is output.

5. A semiconductor memory device according to claim 4, wherein said equalizing section continues an equalization operation until said redundancy word line rises.

6. A semiconductor memory device, comprising:

a memory cell array including word lines, redundancy word lines to be allocated to a defective word line detected out of said word lines, bit lines intersecting said word lines and said redundancy word lines, and dummy bit lines to which dummy cells are connected;

an address transition detecting section for detecting a change in an input cell address signal and for sending out a cell address transition detection signal;

a redundancy selective control section for outputting a defective cell address detection signal and setting a corresponding one of said redundancy word lines to a selective state, when said defective word line is assigned by an input cell address signal;

a read-out potential generating circuit, connected to a selected one of said bit lines, for sending out a read-out potential (VSA) based on data stored in a memory cell to a read-out potential (VSA) node;

a reference potential generating circuit connected to said dummy bit lines and for sending out a reference potential (VREF) to a reference potential (VREF) node; and a comparing and amplifying section for comparing said read-out potential (VSA) with said reference potential (VREF), outputting data of 0 or 1 by amplifying a result of said comparison, and specifying data stored in a memory cell, wherein said semiconductor memory device further includes an equalizing section for equalizing the read-out potential (VSA) node and the reference potential (VREF) node of said comparing and amplifying section when said cell address transition signal is output or when said defective cell address detection signal is output.

7. A semiconductor memory device according to claim 4, wherein said equalizing section continues an equalization operation until said word line rises when said cell address transition signal has been received and continues an equalization operation until said redundancy word line rises when said defective cell address detection signal has been received.

8. A semiconductor memory device according to claim 4, wherein said equalizing section does not carry out an equalization operation during a period of a verification reading.

9. A semiconductor memory device according to claim 2, wherein said read-out potential node and said reference potential node are not equalized during a verification read-out operation.

10. A semiconductor memory device according to claim 5, wherein said equalizing section does not carry out an equalization operation during a period of a verification reading.

11. A semiconductor memory device according to claim 6, wherein said equalizing section does not carry out an equalization operation during a period of a verification reading.

12. A semiconductor memory device according to claim 7, wherein said equalizing section does not carry out an equalization operation during a period of a verification reading.

* * * * *